United States Patent [19]

Makiuchi et al.

[11] Patent Number: 5,252,852
[45] Date of Patent: Oct. 12, 1993

[54] SEMICONDUCTOR DEVICE HAVING FLIP CHIP BONDING PADS MATCHED WITH PIN PHOTODIODES IN A SYMMETRICAL LAYOUT CONFIGURATION

[75] Inventors: Masao Makiuchi, Yamato; Tatsuyuki Sanada, Yokohama; Osamu Wada, Isehara, all of Japan

[73] Assignee: Fujitsu Limited, Kawasaki, Japan

[21] Appl. No.: 989,877

[22] Filed: Dec. 11, 1992

Related U.S. Application Data

[63] Continuation of Ser. No. 693,077, Apr. 29, 1991, abandoned, which is a continuation of Ser. No. 622,284, Dec. 7, 1990, abandoned, which is a continuation of Ser. No. 490,912, Mar. 9, 1990, abandoned.

[30] Foreign Application Priority Data

Mar. 14, 1989 [JP] Japan .................................. 1-61544
May 20, 1989 [JP] Japan .................................. 1-125585

[51] Int. Cl.5 .................. H01L 29/161; H01L 29/205; H01L 29/225; H01L 33/00
[52] U.S. Cl. .................. 257/458; 257/459; 257/461
[58] Field of Search ............. 357/19, 67, 69, 65, 357/16, 17; 257/80, 81, 82, 91, 99, 431, 458, 461, 459

[56] References Cited

U.S. PATENT DOCUMENTS

| | | | |
|---|---|---|---|
| 4,034,399 | 7/1977 | Drukler et al. | 357/69 |
| 4,857,746 | 8/1989 | Kuhlmann et al. | 357/19 |
| 4,912,545 | 3/1990 | Go | 357/67 |

FOREIGN PATENT DOCUMENTS 278380 of 1988 Japan.

OTHER PUBLICATIONS

Electronic Letters vol. 24 No. 23, Nov. 10, 1988, ENAGE GB pp. 1457-1458; S. Chandrasekhar et al.; "Balanced dual photodiodes integrated with a 3dB directional coupler for coherent lightwave receiver".
Electronics Letters, vol. 22, No. 8, Apr. 10, 1986, ENAGE GB pp. 413-415; B. L. Kasper et al.: "Balanced dual-detector receiver for optical heterodyne communication at Gbit/s rates" *the whole document*.
Electronics Letters, vol. 24, No. 2, Jan. 21, 1988, ENAGE GB pp. 109-110; M. Makiuchi et al.: "Small-junction-area GaInAs/InP pin photodiode with a monolithic microlens" *the whole document*.
Electronic Letters, vol. 21, No. 14, Jul. 1985, ENAGE GB pp. 593-595; R. S. Sussmann et al.: "Ultra-low-capacitance flip-chip-bonded GaInAs PIN photodector for long-wavelength high-data-rate fibre-optical systems" *the whole document*.
Electronic Letters, vol. 24, No. 9, Apr. 28, 1988, ENAGE GB pp. 514-516; O. Wada et al.: "Fabrication of monolithic twin-GaInAs pin photodiode for balanced dual-detector optical coherent receivers" *the whole document*.
ECOC 87 Technical Digest, vol. I, Aug. 1988, CPEF c/o Sämöinsinööriliitto R. Y. pp. 39-42; K. Matsuda et al.: "A monolithically integrated InGaAs/InP photoreceiver operating with a single 5V power supply" *FIG. 1*.

Primary Examiner—Andrew J. James
Assistant Examiner—Carl Whitehead, Jr.
Attorney, Agent, or Firm—Staas & Halsey

[57] ABSTRACT

As semiconductor device includes a substrate and first and second semiconductor light receiving elements which are spaced apart and monolithically integrated on the substrate. The light receiving elements each has first and second terminals. A first flip-chip bonding pad is formed on the surface of the device and the device includes a first conductor element which electrically interconnects the first terminals of the elements in series and includes a centrally disposed portion that is electrically connected to the first flip-chip bonding pad. Second and third flip-chip bonding pads are also formed on a surface of the device and elongated electrodes are provided for electrically interconnecting the second terminal of the first light receiving element with the second flip-chip bonding pad and the second terminal of the second light receiving element with the third flip-chip bonding pad. The elongated electrodes have essentially the same length so as to stabilize the optical and electrical balance characteristics of the device and provide a satisfactory dual balance optical receiver.

19 Claims, 18 Drawing Sheets

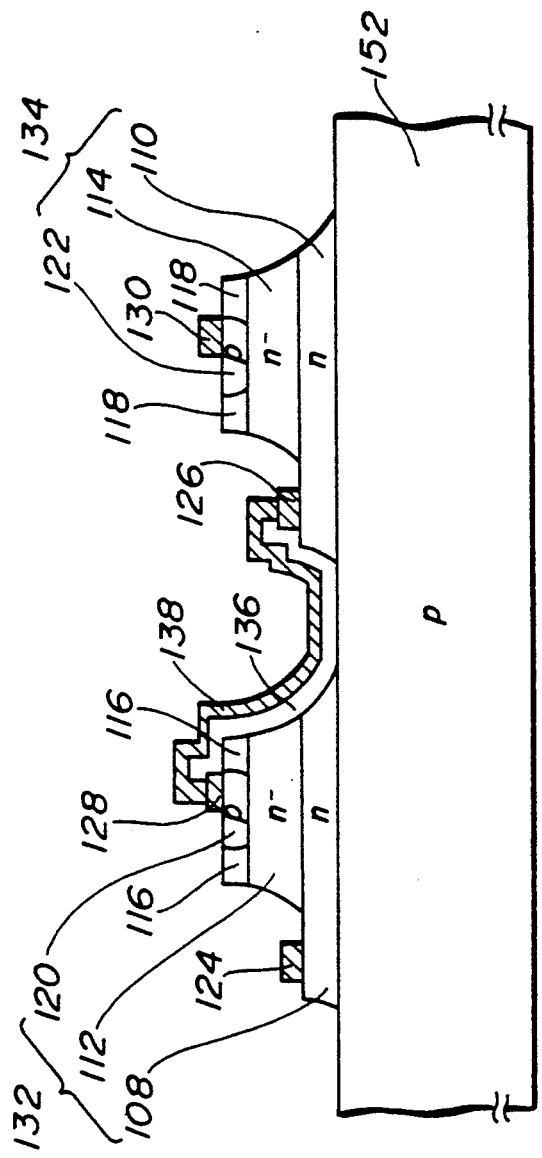

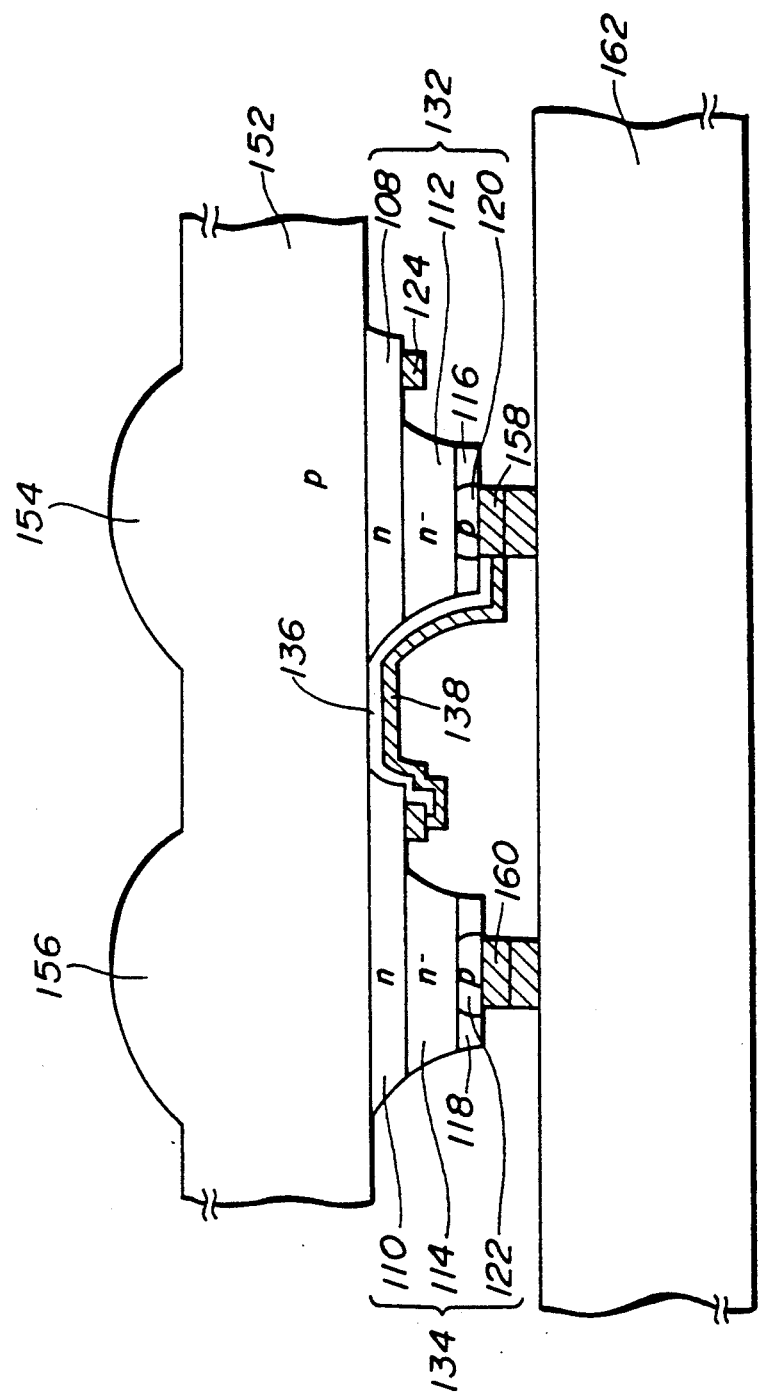

SEMICONDUCTOR DEVICE HAVING FLIP CHIP BONDING PADS MATCHED WITH PIN PHOTODIODES IN A SYMMETRICAL LAYOUT CONFIGURATION

This application is a continuation of application No. 07/693,077, filed Apr. 29, 1991, now abandoned which is a continuation, of application No. 07/622,284, filed Dec. 7, 1990, now abandoned, which is a continuation of 07/490,912 filed Mar. 9, 1990 now abandoned.

BACKGROUND OF THE INVENTION

The present invention generally relates to semiconductor devices, and more particularly to semiconductor devices having semiconductor light receiving elements which are suited for use in a coherent optical communication system.

Presently, there is a need for increasing the speed of communication systems, and coherent optical communication systems provide effective means for realizing high-speed communication.

The use of a heterodyne detection system in coherent optical communication systems has been proposed. The signal obtained is such system has a frequency which is the difference or the sum of the frequency of an actual optical signal and the frequency of an oscillation light from a local oscillator made up of a laser diode. For this reason, the signal-to-noise (S/N) ratio is improved and it is possible to improve the minimum signal reception level of an optical signal receiver.

A dual balanced optical receiver which is made up of two pin photodiodes is used as the optical signal receiver. Uniform optical and electrical characteristics are demanded of the two pin photodiodes of the optical signal receiver.

FIG. 1 is a diagram for explaining a dual balanced optical receiver made up of two pin photodiodes. The dual balanced optical receiver generally comprises pin photodiodes D1 and D2, a positive power source pad P1, a negative power source pad P2, a signal output pad P3, an optical waveguide LG1 for introducing an optical signal, an optical waveguide LG2 for introducing an oscillation light from a local oscillator, and an optical coupler OC which is made up of an optical fiber, a semiconductor or a dielectric material.

In this dual balanced optical receiver, the optical signal input from the optical waveguide LGI and the oscillation light input from the optical waveguide LG2 are mixed in the optical coupler OC and directed to the pin photodiodes D1 and D2. An electrical signal having a frequency which is the difference or the sum of the frequency of the optical signal and the frequency of the oscillation light is obtaine from the signal output pad P3. Of course, the selected frequency of the electrical signal is an intermediate frequency differs from the frequency of the optical carrier of the optical signal. In addition, the electrical signal obtained from the signal output pad P3 is amplified in an intermediate frequency amplifier and is then subjected to appropriate detection depending on modulation system so as to obtain a base band signal. For example, the appropriate detection procedure may involve envelope detection, delay detection, synchronous detection for the like.

When making the dual balanced optical receiver shown in FIG. 1, two pin photodiodes having approximately the same characteristics are selected and used as the pin photodiodes D1 and D2, and there are only a few examples of monolithic integrated circuits which have two pin photodiodes provided on the same semiconductor substrate. In order to further increase the communication speed of the coherent optical communication device, it is important that the characteristics of the two pin photodiodes be uniform and that the stray capacitances of the pin photodiodes and of the electrical interconnections be as small as possible. For this reason, it is considered essential that the semiconductor light receiving elements be integrated on the same semiconductor substrate in the form of a monolithic integrated circuit.

When a plurality of pin photodiodes are formed on the same semiconductor substrate, it should be easier to make the characteristics of the pin photodiodes uniform compared to a case where independent pin photodiodes are provided. However, depending on the layout of the elements of the monolithic integrated circuit, it has been impossible to make a dual balanced optical receiver having satisfactory optical and electrical balance characteristics.

SUMMARY OF THE INVENTION

Accordingly, it is a general object of the present invention to provide a novel and useful semiconductor device in which the problems described above are eliminated.

Another and more specific object of the present invention is to provide a semiconductor device comprising a substrate, and wherein spaced first and second semiconductor light receiving elements are monolithically integrated on the substrate. A first flip-chip bonding pad is formed on a surface of the device and the light receiving elements are each provided with first and second terminals. The device includes a conductor element which electrically interconnects the first terminals of the elements in series and which includes a centrally disposed portion which is electrically connected to the first flip-chip bonding pad. The device also includes second and third flip-chip bonding pads formed on a surface of the device and respective elongated electrodes for electrically interconnecting the second flip-chip bonding pad with the second terminal of the first element and the third flip-chip bonding pad with the second terminal of the second element. In accordance with the invention, the lengths of the elongated electrodes are substantially the same. In accordance with the present invention, it is possible to stabilize the optical and electrical balance characteristics of the semiconductor light receiving elements and the related flip-chip bonding pads and to provide satisfactory dual balanced optical receiver.

Other objects and further features of the present invention will be apparent from the following detailed description when read in conjunction with the accompanying drawings.

BRIEF DESCRIPTION OF THE DRAWINGS

FIG. 16 is a cross sectional view generally showing a seventh embodiment of a semiconductor device according to the present invention;

FIG. 17 is a cross sectional view generally showing an eighth embodiment of a semiconductor device according to the present invention.

DESCRIPTION OF THE PREFERRED EMBODIMENTS

It has been determined experimentally that when a plurality of semiconductor light receiving elements are formed in a semiconductor device to make a dual balanced optical receiver, it is not only necessary to minimize the differences in the characteristics of/the semiconductor light receiving elements but also to prevent the balance and characteristics of the semiconductor light receiving elements from deteriorating due to the effects of wire bonding and the like.

Figure 1:
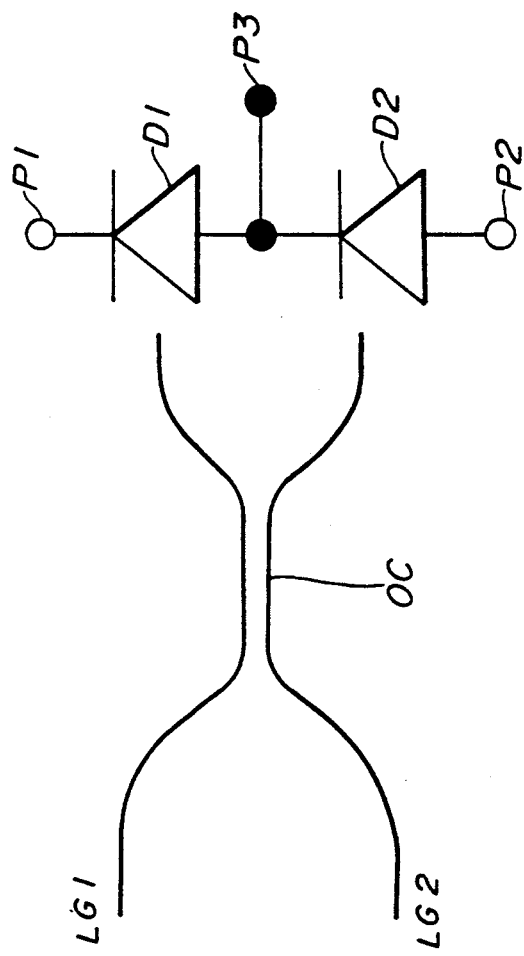
FIG. 1 is a diagram for explaining a prior art dual balanced optical receiver made up of two pin photodiodes.
Figure 2:
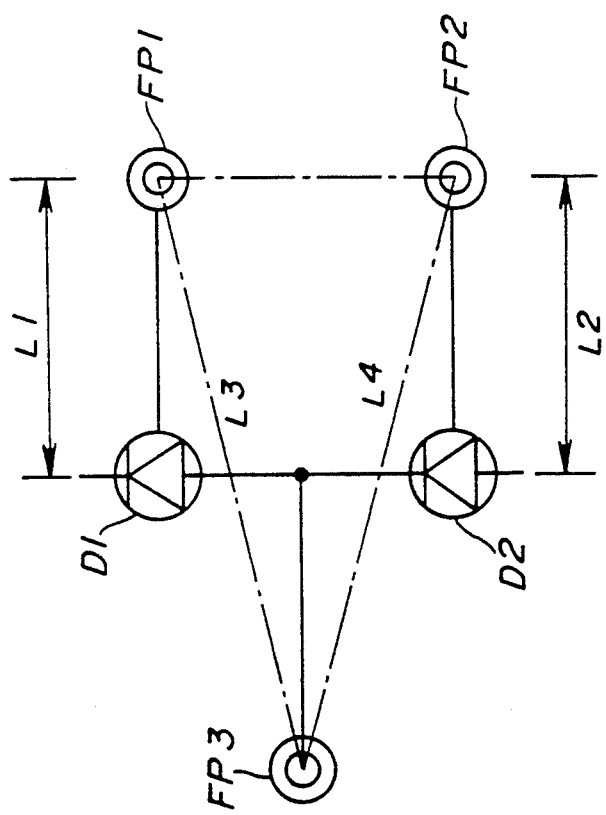
FIGS. 2 through 5 are diagrams for explaining the operating principles of semiconductor devices according to the present invention.

In order to eliminate the undesirable effects of the wire bonding and the like, it has also been found from experiments that following measures are effective. First the semiconductor device is formed using flip-chip bonding techniques and the optical signal is input through a bottom surface of the chip. Second, the semiconductor light receiving elements and the related pads are arranged with a symmetrical layout on approximately the same plane. The operating principles of semiconductor devices prepared according to the present invention, by referring to FIG. 2. In FIG. 2, those parts which are essentially the same as those corresponding parts in FIG. 1 are designated by the same reference numerals.

The semiconductor device shown in FIG. 2 comprises flip-chip bonding pads FP1 and FP2, an electrical signal output pad FP3 employing the flip-chip bonding method, and pin photodiodes D1 and D2. L1 denotes the distance between the pin photodiode D1 and the pad FP1, L2 denotes the distance between the pin photodiode D2 and the pad FP2, L3 denotes the distance between the pads FP3 and FP1, and L4 denotes a distance between the pads FP3 and FP2. Of course, the pads FP1 and FP2 can be used as the positive and negative power source pads.

In this semiconductor device, the layout is such that L1=L2 and L3=L4 and an imaginary line which connects the centers of pads FP1, FP2 and FP3 has the shape of an isosceles triangle.

By making a symmetrical layout of the pin photodiodes D1 and D2 and the pads FP1 though FP3, it is possible to eliminate the deterioration of balance of the characteristics of the semiconductor device.

The symmetrical layout is not limited to that shown in FIG. 2 and various other symmetrical layouts are possible.

Figure 3:
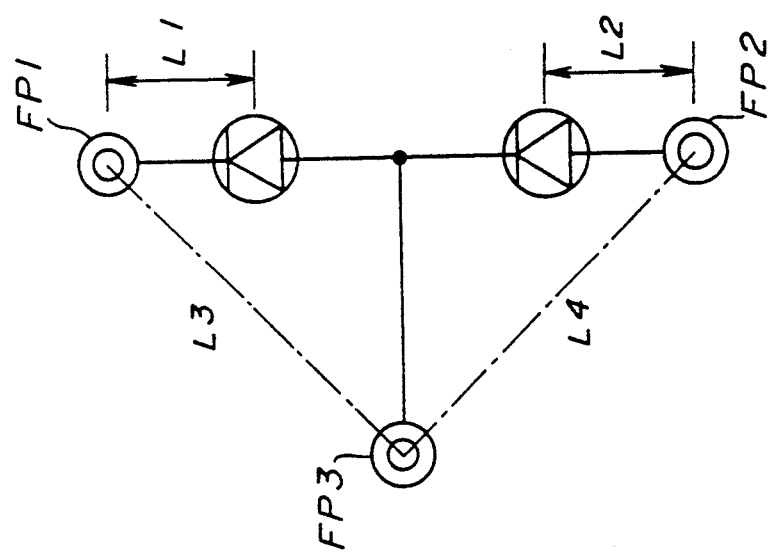

FIG. 3 shows a semiconductor device in which the pin photodiodes D1 and D2 and the pads FP1 and FP2 are arranged on a single straight line. In FIG. 3, parts which are essentially the same as corresponding parts in FIG. 2 are designated by the same reference numerals.

In semicondconductor device of FIG. 3, the layout is such that an imaginary line which connects the centers pads FP1, FP2 and FP3 again has the shape of an isosceles triangle, and L3=L4.

Figure 4:
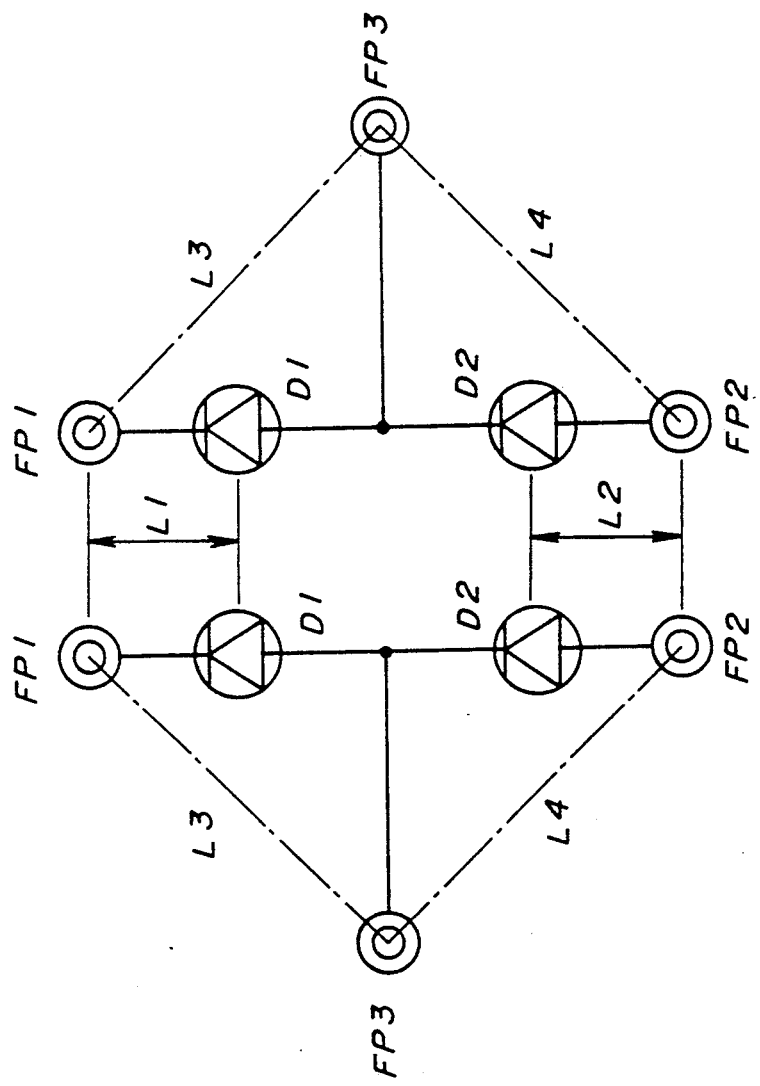

FIG.4 shows a semioonductor device which includes a pair of dual balanced optical receivers. In FIG. 4, parts which are essentially the same as corresponding parts in FIGS. 2 and 3 are designated by the same numerals.

In the semiconductor device of FIG. 4, a symmetrical layout must be maintained between the two dual balanced optical receivers.

Figure 5:
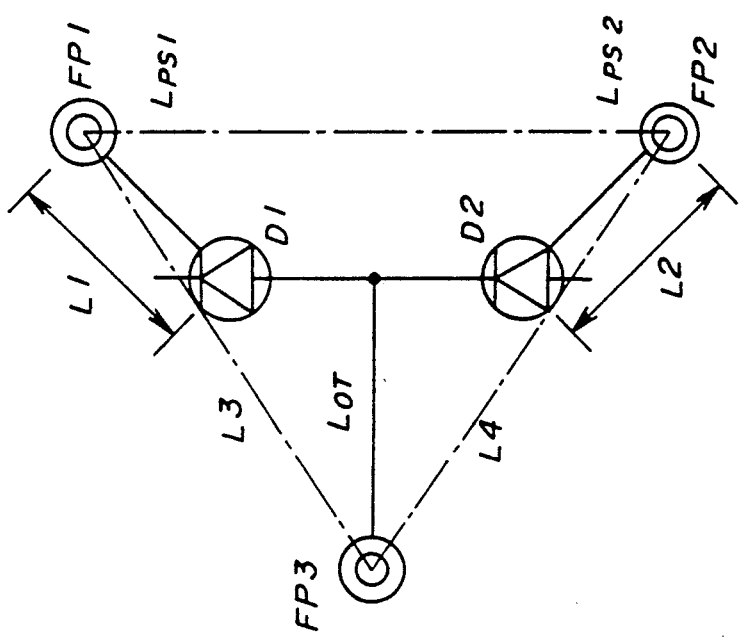

FIG. 5 shows a semiconductor device in which the arrangement of the pads FP1 and FP2 is different that of the device of FIGS. 2 and 3. In other words, the pads FP1 and FP2 are located obliquely relative to the respective pin photodiodes D1 and D2. In FIG. 5 parts which are essentially the same as corresponding parts in FIGS. 2 through 4 are designated by the same reference numerals.

In the semiconductor device shown in FIG. 5, power source voltage supply lines $L_{PS1}$ and $L_{PS2}$ and an electrical signal output line $L_{OT}$ are made of metal. The layout is such th L1=L2 and L3=L4 and an imaginary line which connects the centers of pads FP1, FP2 and FP3 has the shape of an isosceles triangle. When the pads FP1 and FP2 respectively are positive and negative power source pads and the lines $L_{PS1}$, $L_{PS2}$ and $L_{OT}$ are made of metal, it is desirable that the lines $L_{PS1}$, $L_{PS2}$ and $L_{OT}$ are not disposed in parallelism/relative to one another.

Therefore, in semiconductor devices according to the present invention, two semiconductor light receiving elements which are electrically connected in series are formed on a single substrate in the form of a monolithic integrated circuit. For example, the substrate is a semiinsulating InP substrate, and the semiconductor light receiving elements are the pin photodiodes D1 and D2. A first flip-chip pad for outputting the electrical signal from a conductor which interconnects the two semiconductor light receiving elements and second and third flip-chip bonding pads for supplying positive and negative power source voltages to respective ends of the series connected semiconductor light receiving elements are also provided on the substrate. For example, the first flip-chip bonding pad is the pad FP3, and the second and third flip-chip bonding pads respectively are the pads FP1 and FP2. An imaginary line connecting the centers of the first, second and third flip-chip bonding pads shape of an isosceles triangle, where the centers of the first second and third flip-chip bonding pads are located at vertexes of the isosceles triangle. The distance between the centers of the first and second flip-chip bonding pads is the same as the distance between the centers of the first and third flip-chip bonding pads.

In the semiconductor device of the present invention, the optical and electrical balance and other characteristics of the plurality of semiconductor light receiving elements and related pads are satisfactory, and the semiconductor device is suited for use in connection with dual balanced optical applications receiver applications.

Figure 6:
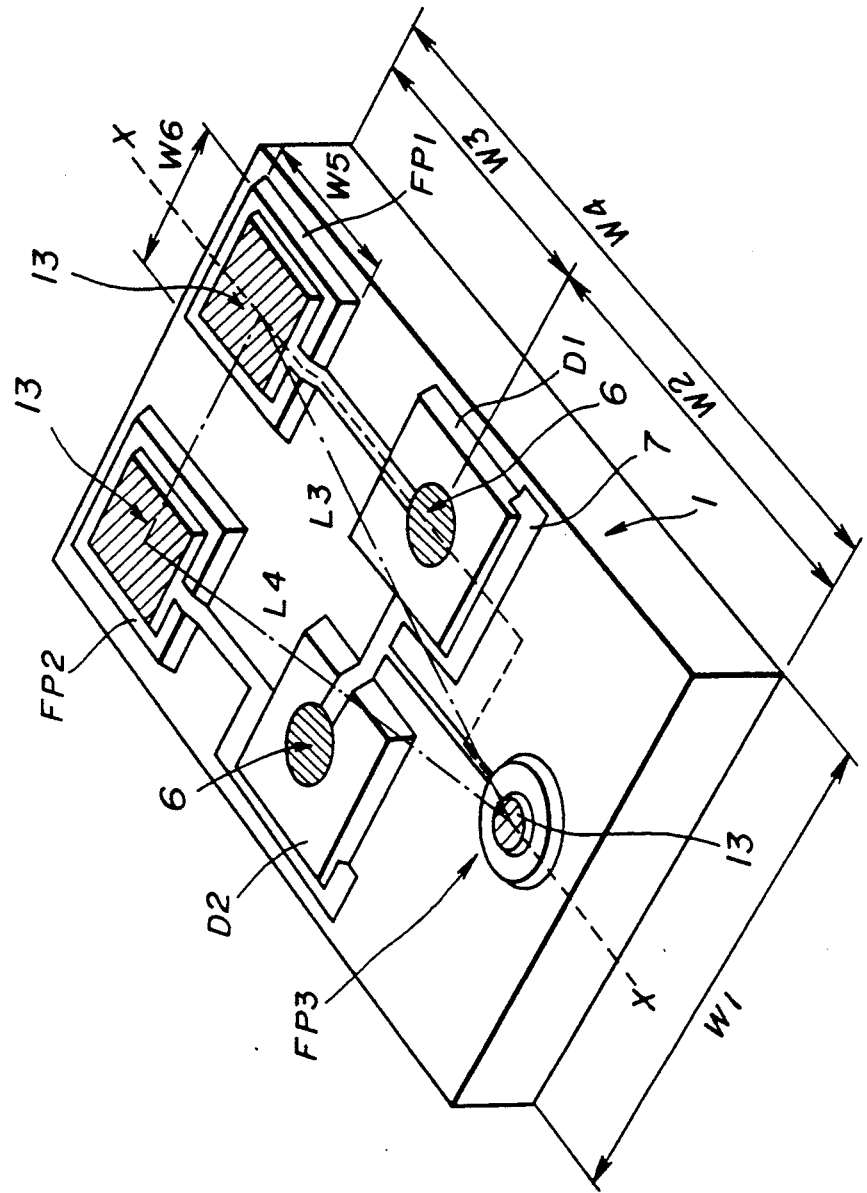
FIG. 6 is a perspective view showing an essential part of a first embodiment of a semiconductor device according to the present invention.
Figure 7:
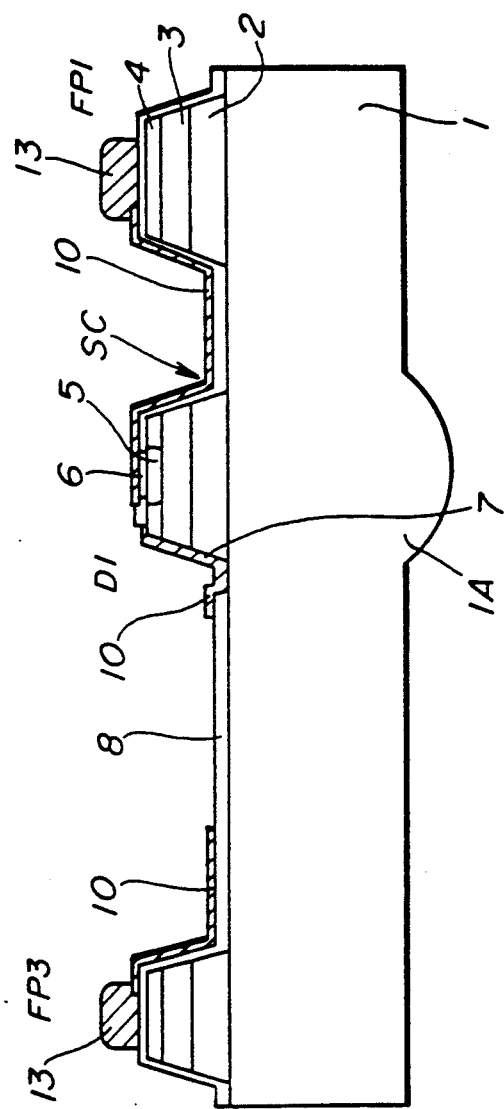
FIG. 7 is a cross sectional view of the first embodiment taken along a line X—X in FIG. 6.

A description will now be given of a first embodiment of the semiconductor device according to the present invention, by referring to FIGS. 6 and 7. FIG. 6 is a perspective view showing an essential part of the first embodiment FIG. 7 is a cross sectional view of the first embodiment taken along a line X—X in FIG. 6. In FIGS. 6 and 7, parts which are essentially the same as corresponding parts in FIGS. 2 through 5 are designated by the same reference numerals.

In FIGS. 6 and 7, the semiconductor device comprises a semiinsulating InP substrate 1, a lens 1A which is provided on a bottom surface of the substrate 1, an $n^+$-type InP buffer layer 2, an undoped InGaAs active layer 3, an $n^-$-type I layer 4, a p-type region 5 which is formed by diffusion of Zn a p side electrode 6 which is made up of a AuZn/Au stacked structure, an n side electrode 7 which is made up of a AuGe/Au stacked structure, a SiN layer 8, an interconnection 10 which is made up of a Ti/Au stacked structure, and a bump 13 which includes AuSn as the main component.

In this embodiment, the centers of pads FP1, FP2 and FP3 are located at the vertexes of an isosceles triangle which is formed by an imaginary line connecting the pads FP1, FP2 and FP3. In addition, L3=L4.

For example, the dimensions of the layout for this embodiment are as follows. The distances W1 through W6 are selected such that W1=250 μm, W2=W3 =150 μm, W4=W2+W3=300 μm, and W5=W6=40 μm. In addition, the diameter of the light absorbing part at the p side electrode 6 is 20 μm, and the diameter of the bump 13 is 15 μm.

Figure 8:
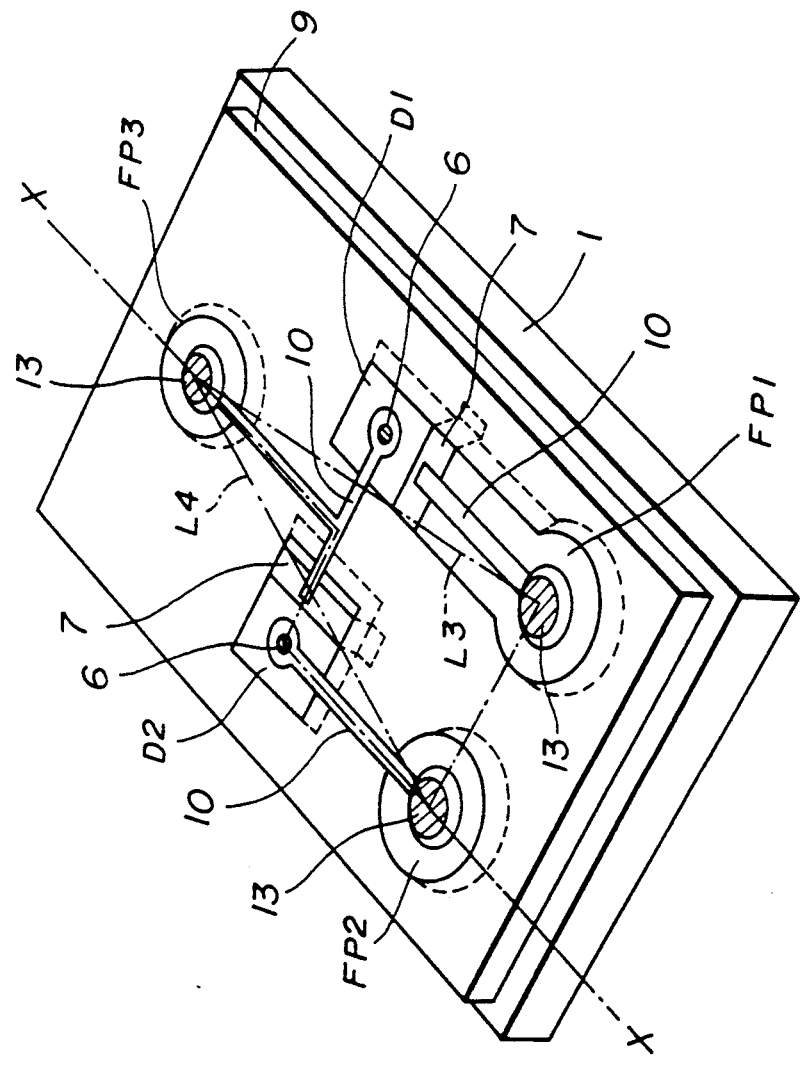
FIG. 8 is a perspective view showing an essential part of a second embodiment of the semiconductor device according to a present invention.

A second embodiment of a semiconductor device according to the present invention is illustrated in FIG. 8. In FIG. 8, parts which are essentially the same as corresponding parts in FIGS. 2 through 7 are designated by the same reference numerals.

In FIG. 8, the semiconductor device comprises a photosensitive polyimide resin layer 9. The resin layer 9 fills depressions at the top surface of the semiconductor device. For this reason, the top surface of the semiconductor is flat even though the mesa structures of the pin photodiodes D1 and D2 and the bumps of the flip-chip bonding pad FP1 and FP2 are present. Moreover, with this structure stray electrostatic capacitance is reduced considerably.

In the embodiment shown in FIG.7, for example, the side surface of the $n^+$-type InP buffer layer 2 is always exposed because the pin photodiodes D1 and D2 have mesa structures. The interconnecting conductor 10 is formed on the exposed side surface of the $n^+$-type InP buffer layer 2 via the SiN layer 8. Thus, it is inevitable that a stray electrostatic capacitance is generated at the portion SC indicated by an arrow in FIG. 7. But according embodiment, the interconnecting conductor 10 is disposed above the resin layer 9 and the stray capacitance is reduced.

A method of producing the device of FIG. 8, is now described by referring to FIGS. 9A through 9D. FIGS. 9A through 9D respectively show the cross section of the semiconductor device along a line X—X in FIG. 8 at various stages during the production process. In FIGS. 9A through 9D, parts which are essentially the same as corresponding parts in FIGS. 2 through 8 are designated by the same reference numerals.

Figure 9A:
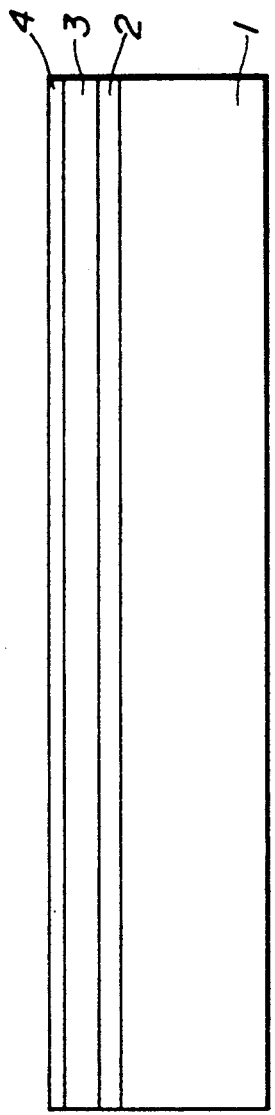
FIGS. 9A through 9D are cross sectional views for explaining a method of producing the second embodiment shown in FIG. 8.
Figure 9B:
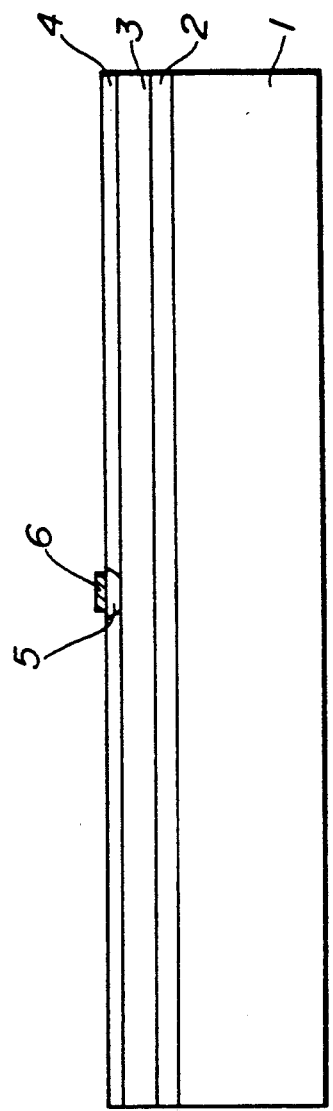

In FIG. 9A, metal organic vapor phase epitaxy (MOVPE) is used to successively form on the $n^+$-type InP buffer layer 2, the undoped InGaAs active layer 3 and the $n^-$-type InP cap layer 4 on the semiinsulating InP substrate 4. For example, the data for layers 2 through 4 are as follows.

Buffer layer 2:
Thickness: 1.5 μm
Impurity density: $1 \times 10^{18}$ cm$^{-3}$
Active layer 3:
Composition: $In_{0.47}Ga_{0.53}As$
Thickness: 2.8 μm
Cap layer 4:
Thickness: 1.0 μm
Impurity density: $1 \times 10^{16}$ cm$^{-3}$ In FIG. 9B, plasma chemical vapor deposition (CVD) is used to form a SiN layer on the cap layer 4. For example, this SiN layer has a thickness in the order of 1000 Å. Then, a wet etching procedure using buffered fluorine as the etchant is used to selectively etch the SiN layer so as to form an opening which corresponds to location where the p-type impurity region of the pin photodiode is to be formed. Next, a closed-tube type vapor phase diffusion technique is used to form the p-type region 5 using the SiN layer as a mask, introducing Zn to the cap layer 4 and carrying out a thermal process at 500° C. for 30 minutes. Thereafter, the SiN layer which is used as the mask when forming the p-type region 5 is removed.

A resist process of a normal photolithography technique is used to form a photoresist layer having an opening at a location where the p side electrode 6 is to be formed. Using a vacuum evaporation, an electrode layer is formed on the entire top surface of the semconductor device. For example, the electrode layer is made up of a Au/Zn/Au stacked structure, where the thicknesses of the layers making up the Au/Zn/Au stacked structure are 100 Å/60 Å/340 Å A. Then, the semiconductor device is submerged in acetone to remove the photoresist layer. The p side electrode 6 is formed by lift-off patterning of the electrode layer. An alloying thermal process is then carried out at 430° C. for 5 minutes.

Figure 9C:
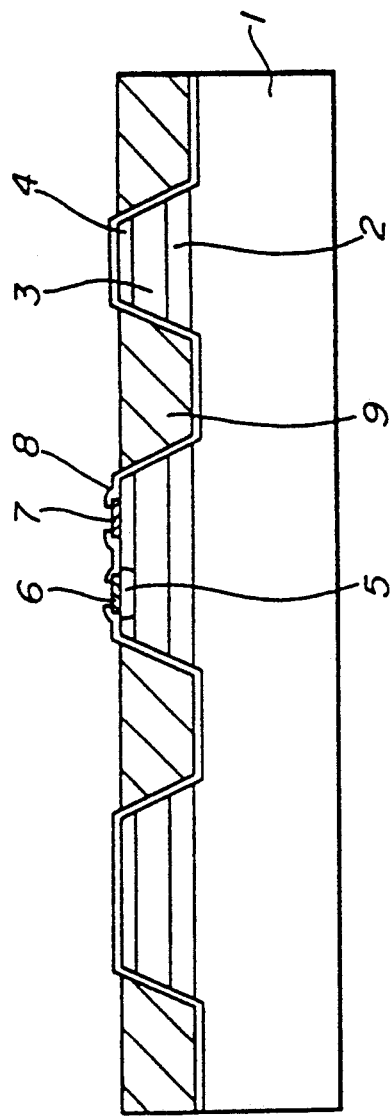

In FIG. 9C, a resist process of a normal photolithography technique is used to form a photoresist layer which covers the pin photodiode portion and the pad portion. For example, a photoresist AZ manufactured by Hoechst of West Germany may be used for forming the photoresist layer. Ion beam etching employing Ar ions is used for mesa etching of the structure from the surface of the semiconductor device to the semiinsulating InP substrate 1. This ion beam etching is carried out under the following conditions:

Ar gas pressure $2 \times 10^{-4}$ Torr
Ion beam incident angle: 75°
Ion current: 200 mA
Acceleration voltage: 500 V The n side electrode 7 is formed using a resist process of a normal photolithography technique, vacuum evaporation and a lift-off technique. For example, the n side electrode 7 is made up of a AuGe/Au stacked structure, where the thicknesses of the layers making up the AuGe/Au stacked structure are 500 Å/1000 Å. An alloying thermal process is carried out at 380° C. for 1 minute. The SiN layer 8 is then formed to a thickness in the order of 2000 Å, for example, by plasma CVD. The resin layer 9 is formed on the entire top surface of the semiconductor device by a spin-coat technique.

The resin layer 9 is patterned using a resist process of a normal photolithography technique, and curing is carried out thereafter at 200° C., 300° C. and 400° C. respectively for 30 minutes. The SiN layer 8 is selectively etched by wet etching using a buffered fluorine as the etchant, and contact holes are respectively formed above the p and n side electrodes 6 and 7.

Figure 9D:
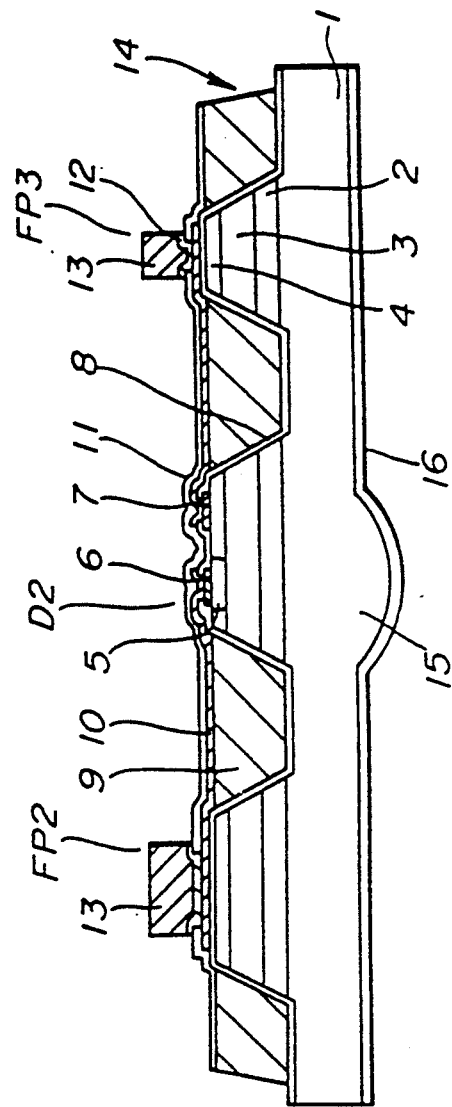

With reference to FIG. 9D, the interconnecting conductor 10 is formed by using a process of a normal photolithography technique, vacuum evaporation and a lift-off technique. For example, conductor 10 is made up of a Ti/Au stacked structure, where the thicknesses of the layers making up the Ti/Au stacked structure are 1000 Å/2000 Å. The SiN layer 11 is formed to a thickness in the order of 2000 Å, for example, by using plasma CVD. The SiN layer 11 is selectively etched by wet etching using as a buffered fluorine as the etchant, and contact holes are formed in bump regions of the flip-chip bonding pads.

A Ti/Pt layer 12 which functions as a barrier metal is formed on the entire top surface of the semiconductor device by electron beam vapor deposition. For example, the thicknesses of the layers making up the Ti/Pt layer 12 are 1000 Å/2000 Å. Then, a photoresist layer having openings at portions where the bumps are to be formed is formed using by a resist process of a normal photolithography technique.

A bump 13 is formed by Sn plating to a thickness of 5 μm, for example, using a selective plating technique. A protection layer made up of a photoresist is formed on the surface of the bump 13 using a resist process of a normal photolithography technique. Then, the protection layer on the bump 13 is used as a mask to selectively remove the Ti/Pt layer 12 by technique ion beam etching technique. A groove which corresponds to a scribe line is formed by selectively etching the SiN layer 11 by use of a wet etching procedure using a buffered fluorine as the etchant.

Next, the SiN layer 11 is used as a mask to selectively remove the resin layer 19 and a groove 14 is formed to facilitate the cleaving process which is carried out at a later stage by reactive ion etching (RIE) using oxygen as the reactive gas. For example, 150 μm of the bottom surface portion of the substrate 1 is polished by a mechanical polishing process. Then, the substrate 1 is selectively etched to form a lens 15 which has a center thickness in the order of 9 μm by using a resist process of a normal photolithography technique and ion beam etching with Ar ions. A SiN reflection preventing layer 16 having thickness in the order of 2000 Å, for example is formed on the bottom surface of the substrate 1 including the lens 15 using plasma CVD. Finally, a cleaving process is carried out.

Figure 10:
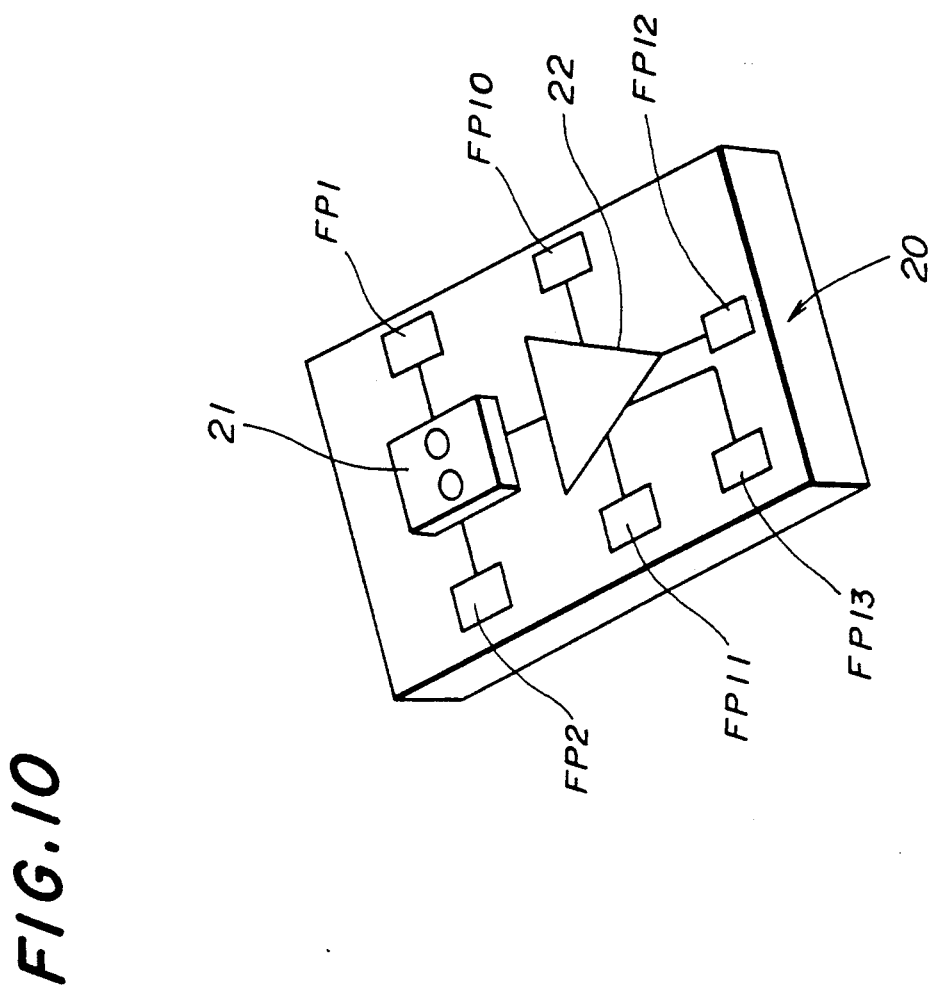
FIG. 10 is a perspective view generally showing a third embodiment of a semiconductor device according to the present invention.

A third embodiment of a semiconductor device according to the present invention, is described by referring to FIG. 10. The semiconductor device shown in FIG. 10 comprises a semiinsulating substrate 20, a twin pin photodiode 21 which is made up of a pair of pin photodiodes similar to the pin photodiodes D1 and D2 of the first and second embodiments, an amplifier 22, and pads FP1, FP2 and FP10 through FP13. The output signals from the twin pin photodiode 21 are amplified by the amplifier 22, and this semiconductor device functions as a dual balanced optical receiver.

Figure 11:
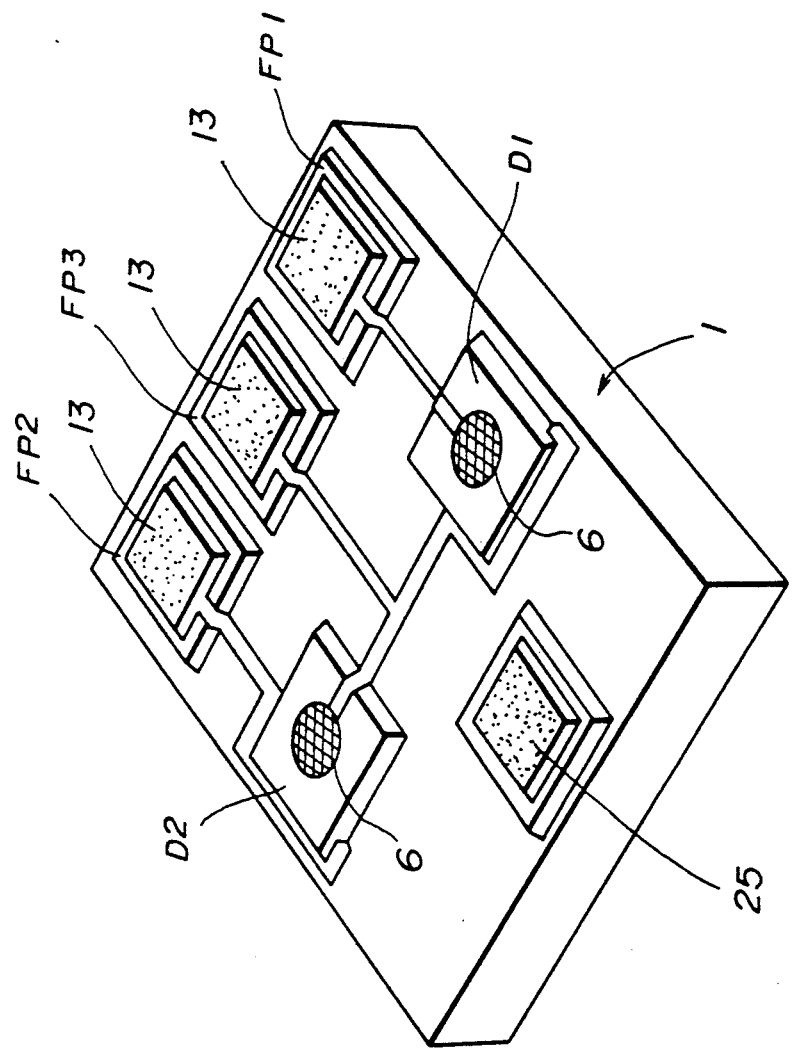
FIG. 11 is a perspective view generally showing a fourth embodiment of a semiconductor device according to the present invention.

FIG. 11 generally shows a fourth embodiment of a semiconductor device according to the present invention. In FIG. 11, parts which are essentially the same as those corresponding parts in FIG. 6 are designated by the same reference numerals, and a description thereof will be omitted. In this embodiment, the pads FP1, FP2 and FP3 are aligned on a straight line, and a dummy pad 25 is located on the side of the pin photodiodes D1 and D2 which is opposite from to the side on which the pads FP1 through FP3 are provided.

In each of the embodiments described above, structure of the pin photodiodes in the monolithic integrated circuit may take various forms. A number of embodiments of the structure of the pin photodiodes are described hereinbelow.

Figure 12:
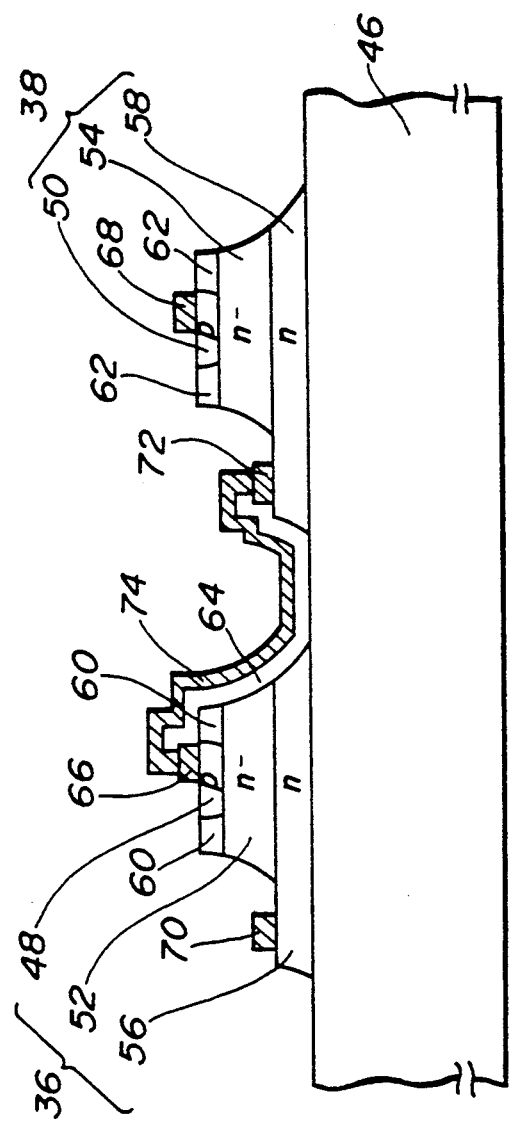
FIG. 12 is a cross sectional view generally showing a fifth embodiment of a semiconductor device according to the present invention.

FIG. 12 generally shows a fifth embodiment of a semiconductor device according to the present invention. Two pin photodiodes 36 and 38 are formed adjacent to each other with a mesa structure on a semiinsulating substrate 46. The pin photodiode 36 comprises a p-type layer 48, an intrinsic layer 52, and an n-type layer 56. The pin photodiode 48 comprises a p-type layer 50, an intrinsic layer 54, and an n-type layer 58. The side surfaces of the p-type layers 48 and 50 are respectively surrounded by n-type layers 60 and 62. The n-type layers 56 and 58 respectively connect to the substrate 46.

The mesa surfaces of the p-type layers 48 and 50, the intrinsic layers 52, 54 and the n-type layers 56 and 58 and the surface of the substrate 76 between the pin photodiodes 36 and 38 are all covered by a passivation layer 64. In addition, p side contact electrodes 66 and 68 are respectively formed on the p-type layers 48 and 50, and n side contact electrodes 70 and 72 are respectively formed on the n-type layers 56 and 58. The p side contact electrode 36 of the pin photodiode 36 and the n side contact electrode 72 of the in photodiode 38 are connected by a metal interconnecting conductor layer 74 which is formed on the passivation layer 64.

Figure 13:
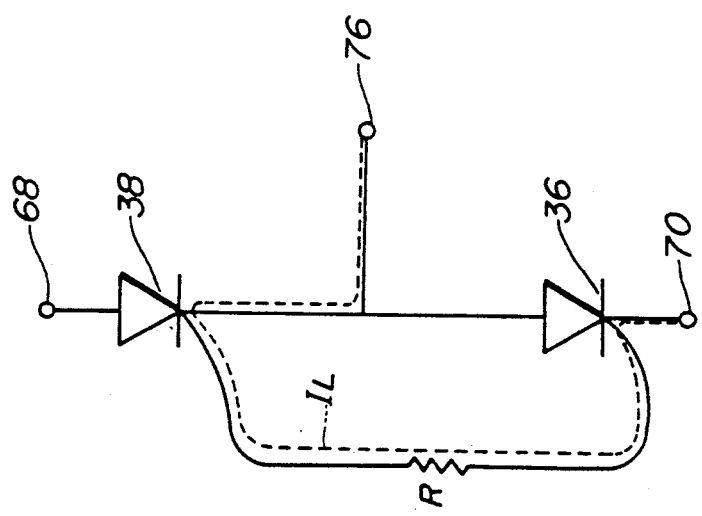
FIG. 13 is an equivalent circuit diagram of the twin pin photodiodes shown in FIG. 12.

In such structure leakage may occur along a path due to defects within the substrate 46. In addition, a leakage path is presented at the surface of the substrate 46 due to the interface state and generation of a surface inversion layer at the interface between the substrate 46 and the passivation layer 64. For this reason, when a reverse bias is applied across the n side contact electrode 70 of the pin photodiode 36 and the p side contact electrode 68 of the pin photodiode 38, an equivalent circuit of the twin pin photodiode which is made up of the pin photodiodes 36 and 38 is as shown in FIG. 13. As may be seen from FIG. 13, a leak current $I_L$ indicated by a phantom line flows from the n side contact electrode 70 of the pin photodiode 36 to the n side contact electrode 72 (that is, output terminal 76) of the pin photodiode 38 via a leakage path within the substrate 46 or at the surface of the substrate 46. A resistor R corresponds to the resistances of the leakage path within the substrate 46 and the leakage path at the surface of the substrate 46.

The leak current $I_L$ may become several tens of μA or greater. As a result, the leak current $I_L$ deteriorates the characteristics and reliability of the pin photodiodes 36 and 38, and the performance of the dual balanced optical receiver becomes poor.

Accordingly several embodiments in which generation of the leak current is positively prevented so as to improve the performance of the dual balanced optical receiver are described below.

Figure 14:
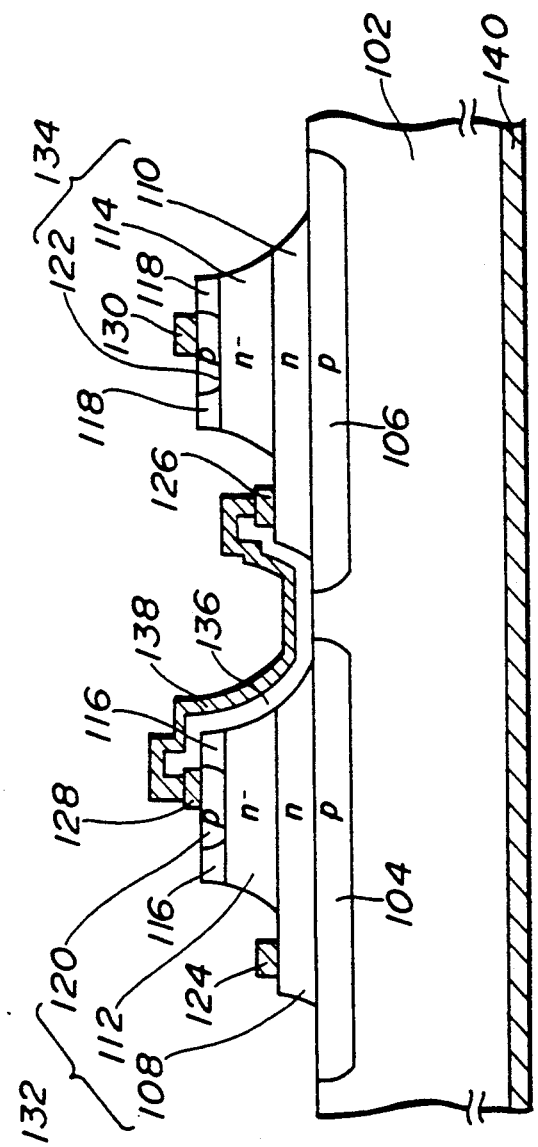
FIG. 14 is a cross sectional view generally showing a sixth embodiment of a semiconductor device according to the present invention.

A sixth embodiment of a semiconductor device according to the present invention is described with reference to FIG. 14. In FIG. 14, p-type InP regions 104 and 106 having an impurity density of $10^{15}$ to $10^{16}$ cm$^{-3}$ are formed adjacent to each other at the surface portion of a semiinsulating InP substrate 102. An n-type InP layer 108 having a thickness of 2 μm and an impurity density of $10^{18}$ cm$^{-3}$, an n$^-$-type InGaAs layer 112 having a thickness of 2.5 μm and an impurity density of $10^{15}$ cm$^{-3}$ and an n-type InP layer 116 having a thickness of 1 μm and an impurity density of $10^{16}$ cm$^{-3}$ are lattice matched and successively formed on the p-type InP layer 104. Similarly, an n-type InP layer 110 having a thickness of 2 μm and an impurity density $10^{18}$ cm$^{-3}$, an n$^-$-type InGaAs layer 114 having a thickness of 2.5 μm and an impurity density of $10^{15}$ cm$^{-3}$ and an n-type InP layer 118 having a thickness of 1 μm and an impurity density of $10^{16}$ cm$^{-3}$ are lattice matched and successively formed on the p-type InP layer 106.

P-type InP regions 120 and 122 having high impurity densities are respectively formed at predetermined locations of the n-type InP layers 116 and 118. The p-type InP regions 120 and 122 respectively make contact with the n$^-$-type InGaAs layers 112 and 114. N side contact electrodes 124 and 126 are respectively formed on the n-type InP layers 108 and 110. P side contact electrodes 128 and 130 are respectively formed on the p-type InP regions 120 and 122. In order to reduce the photodiode capacitance, the light receiving diameter of the light receiving parts, excluding parts from the surface of the p-type InP regions 120 and 122 to the p side contact electrodes 128 and 130, is suppressed to 20 μm.

Accordingly, a pin photodiode 132, which is made up of the p-type InP region 120, the n$^-$-type InGaAs layer 112 and the n-type InP layer 108, is formed adjacent to a pin photodiode 134 made up of the p-type InP region 122, the n$^-$-type InGaAs layer 114 and the n-type InP layer 110.

The mesa surfaces of the n-type InP layers 108 and 110, the n$^-$-type InGaAs layers 112 and 114, the n-type InP layers 116, 118 and the p-type InP regions 120 and 122, and the surface of the substrate 102 between the two pin photodiodes 132 and 134, are covered by an SiN passivation layer 136. In addition, the p side contact electrode 128 of the pin photodiode 132 and the n side contact electrode 126 of the pin photodiode 134 are connected by a conductive metal interconnecting layer 138 which is formed on the SiN passivation layer 136. A metallized surface 140 made of Au or the like is formed on the bottom surface of the substrate 102 for chip-bonding the semiconductor device on a ceramic substrate, for example.

The impurity density of the p-type InP regions 104 and 106 is desirably in the range of approximately $10^{15}$ to $10^{16}$ cm$^{-3}$. If the impurity density is too low, an effective pn junction cannot be formed between the n-type InP layers 108 and 110. On the other hand, if the impurity density is too high, a breakdown may occur between the p-type InP regions 104 and 106 and the n-type InP layers 108 and 110. Accordingly, the upper limit of the impurity density of the p-type InP regions 104 and 106 is set to a value such that it is possible to obtain a breakdown withstanding voltage which is approximately the same as or greater than the voltage applied to the pin photodiodes 132 and 134.

It is not essential that both the p-type InP regions 104 and 106 be provided respective pin photodiodes 132 and 134. For example, it is possible to provide only the p-type InP region 104 between the n-type InP layer 108 and the substrate 102 for the photodiode 132.

A method of producing the semiconductor device shown in FIG. 14 is as follows. The p-type InP regions 104 and 106 are selectively formed at two adjacent locat surface portion of the InP substrate 102 by diffusion of ZN or by implantation of Cd, Zn or Be an the like. A metal organic chemical vapor deposition (MOCVD) is used to successively form an n-type InP layer, an n$^-$-type InGaAs layer and an n-type InP layer with lattice matching on the p-type InP regions 104 and 106 and the InP substrate 102. Zn is diffused into the n-type InP layer to form p-ty e regions 120 and 122 of high impurity density, which make contact with the n$^-$-type InGaAs layer.

Next, mesa etching is carried out with respect to the n-type InP layer, the n$^-$-type InGaAs layer and the n-type InP layer to isolate these layers into two pin structures. One pin structure comprises the n-type InP layer 108, the n$^-$-type InGaAs layer 112, the n-type InP layer 116 and the p-type InP region 120. The other pin structure comprises the n-type InP layer 110, the n$^-$-type InGaAs layer 114, the n-type InP layer 118 and the p-type InP region 122.

Mesa etching then carried out with respect to the n$^-$-type InGaAs layers 112 and 114 and the n-type InP layers 116 and 118 so as to expose portions of the n-type InP layers 108 and 110. The exposed portions of the n-type InP layers 108 and 110 are used for forming a contact electrode thereon.

A SiN passivation layer 136 is formed on the entire top surface of the semiconductor device. That is, the mesa surfaces of the n-type InP layers 108 and 110, the n$^-$-type InGaAs layers 112 and 114, the n-type InP layers 116; 118 and the p-type InP regions 120 and 122 and the surface of the InP substrate 102 between the two pin structures are all covered by the SiN passivation layer 136. Contact holes are formed at predetermined positions using a lithography technique, and n side contact electrodes 124 and 126 of AuGe are respectively formed on the n-type InP layers 108 and 110 and p side contact electrodes 128 and 130 are respectively formed on the p-type InP regions 120 and 122.

The metal interconnecting layer 138 is formed on the SiN passivation layer 136 so as to connect the p side contact electrode 128 of the pin photodiode 132 and the n side contact electrode 126 of the pin photodiode 134.

In addition, a metallized surface 140 made of Au or the like is formed on the bottom surface of the InP substrate 102. For example, the metallized surface 140 is used for chip-bonding the semiconductor device onto a ceramic substrate.

Figure 15:
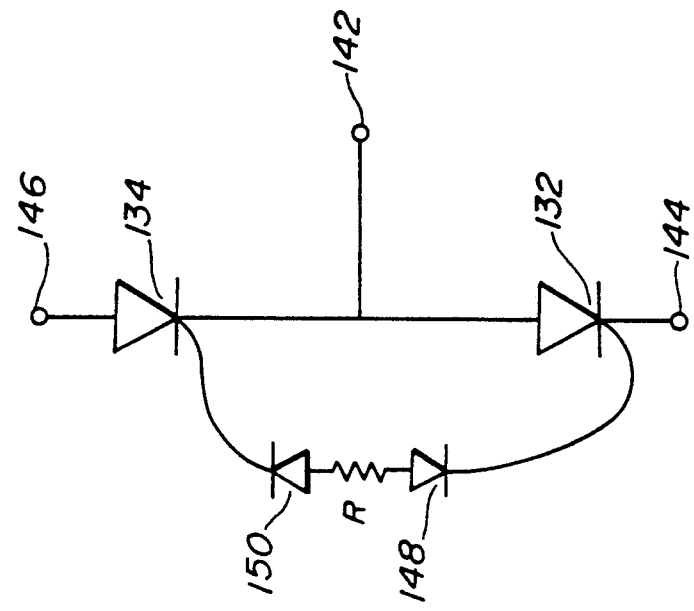
FIG. 15 is an equivalent circuit diagram of the sixth embodiment.

The operation of the sixth embodiment described referring to FIG. 15 which shows an equivalent circuit of this embodiment. In FIG. 15, the two pin photodiodes 132 and 134 are connected in series, and an output terminal 142 is connected to the conductor element which connects the two pin photodiodes 132 and 134. In addition, the n side contact electrode 124 of the pin photodiode 132 and the p side contact electrode 130 of the pin photodiode 134 are respectively connected to terminals 142 and 144.

As in the case of conventional semiconductor devices, it is possible to consider leakage paths in the pin photodiodes 132 and 134, that is, a leakage path due to defects Within the substrate 102 and a leakage path at the interface between the substrate 102 and the SiN passivation layer 136. However, in this embodiment, the p-type InP region 104 is provided between the n-type InP layer 108 of the pin photodiode 132 and the substrate 102, and the p-type InP region 106 is provided between the n-type InP layer 110 of the pin photodiode 134 and the substrate 102. For this reason, diodes 148 and 150 are formed as shown in FIG. 15. The diode 148 has a pn junction formed of the p-type InP region 104 and the n-type InP layer 108, and the diode 150 has a pn junction formed of the p-type InP region 106 and the n-type InP layer 110. A resistor R between the diodes 148 and 150 corresponds to the resistances of a leakage path within the substrate 102 and a leakage path at the surface of the substrate 102.

Accordingly, even when a predetermined voltage is applied across the terminals 142 and 144 so that the pin photodiodes 132 and 134 are reverse biased, the leak current $I_L$ which flows from the n side contact electrode 124 of the pin photodiode 132 to the n side contact electrode 126 of the pin photodiode 134 via the the leakage path within the substrate 102 or at the surface of the substrate 102 is blocked by the diode 148 which is connected in a reverse direction to the current flow. In other words, the diode 148 prevents the leak current $I_L$ from flowing to the output terminal 140.

According to this sixth embodiment, the diode 148, which is connected in the reverse direction to the flow of the leak current $I_L$, is formed by the provision of the p-type InP region 104 between the n-type InP layer 108 of the pin photodiode 132 and the substrate 102 and the p-type InP region 106 between the n-type InP layer 110 of the pin photodiode 134 and the substrate 102. As result current $I_L$ is reduced to a value which is not more than 1/100 of the value of the leak current in the fifth embodiment.

A seventh embodiment of a semiconductor device according to the present invention is illustrated in FIG. 16. In FIG. 16, parts which are essentially the same as corresponding parts in FIG. 14 are designated by the same reference numerals, and a description thereof will be omitted. In this embodiment, a p-type InP substrate 152 which has an impurity density of approximately $10^{15}$ to $10^{16}$ cm$^{-3}$ is used in place of the InP substrate 102 of the sixth embodiment. In addition, the p-type InP regions 104 and 106 and the metallized surface 140 of the sixth embodiment are omitted. Hence, the n-type InP layers 108 and 110 and the SiN passivation layer 136 are formed directly on the p-type InP substrate 152.

In this embodiment, diodes are formed to block leak current $I_L$ similarly to the sixth embodiment. One diode has a pn junction formed of the p-type InP substrate 152 and the n-type InP layer 108 of the pin photodiode 132, and another diode has a pn junction formed of the p-type InP substrate 152 and the n-type InP layer 110 of the pin photodiode 134. The effects of this embodiment are basically the same as those obtainable in the sixth embodiment.

An eighth embodiment of a semiconductor device according to the present invention, is illustrated in FIG. 17. In FIG.17, parts which are essentially the same as corresponding parts in FIG. 16 are designated by the same reference numerals, and a description thereof will be omitted. In this embodiment, converging lenses 154 and 156 are formed on the back surface of the p-type InP substrate 152 at positions corresponding to the two pin photodiodes 132 and 134. There is no need to provide light receiving parts at the surfaces of the p-type InP regions 120 and 122, and only p side contact electrodes 158 and 160 are formed. The p side contact electrodes 158 and 160 are used for flip-chip bonding the semiconductor device onto a ceramic substrate 162.

In this embodiment, it is possible to obtain effects which are basically the same as those obtainable with the seventh embodiment. In addition, it is possible to reduce the size of the pin photodiodes 132 and 134 and accordingly reduce the stray capacitance because the converging lenses 154 and 156 ensure appropriate light reception at the pin photodiodes 132 and 134. Moreover, although stray capacitance increases when the p-type InP substrate 152 of the seventh embodiment is bonded directly onto the ceramic substrate, this eighth embodiment eliminates the deficiency of the seventh embodiment by flip-chip bonding the semiconductor device onto the ceramic substrate 162 by way of the p side contact electrodes 158 and 160.

Figure 18:
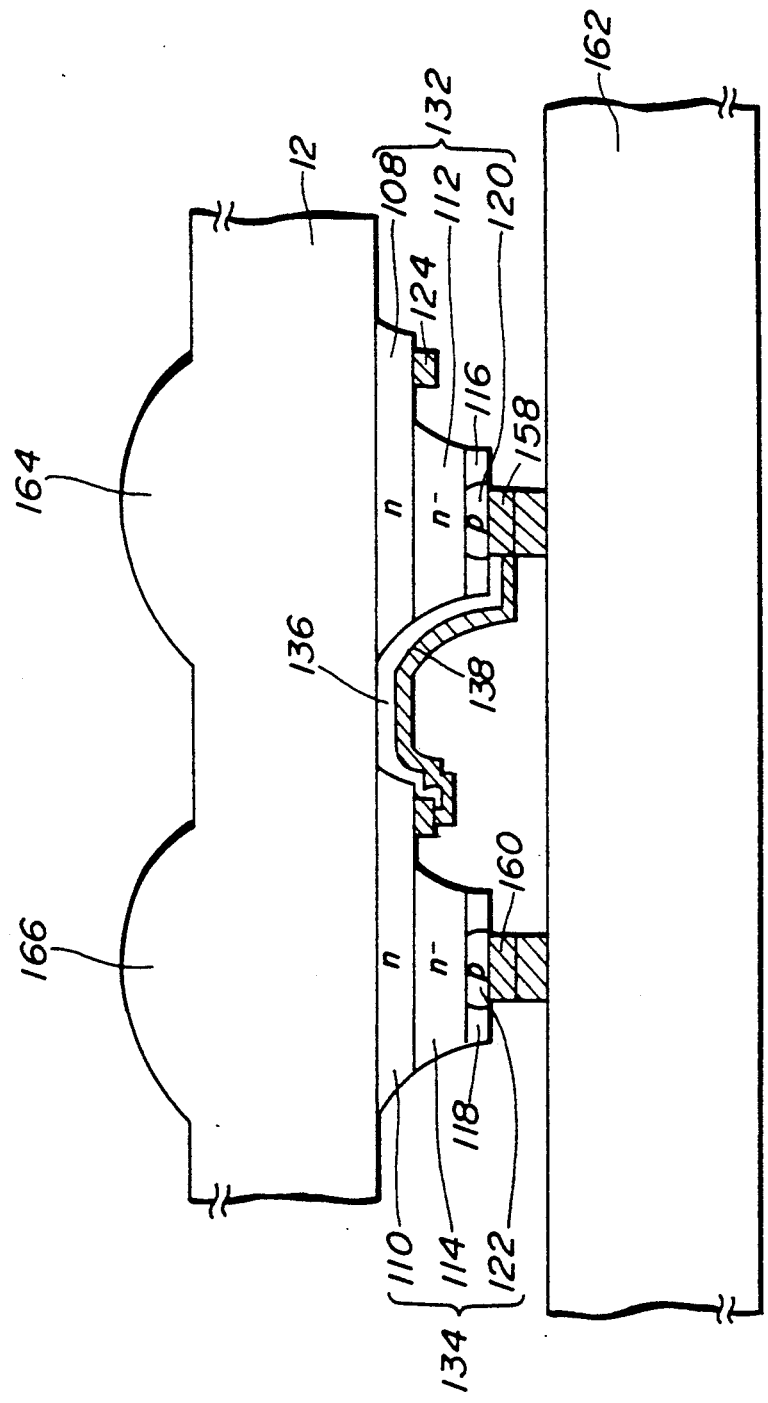
FIG. 18 is a cross sectional view generally showing a ninth embodiment of a semiconductor device according to the present invention.

A ninth embodiment of the semiconductor device according to the present invention is illustrated in FIG. 18. In FIG. 18, parts which are essentially the same as corresponding parts in FIGS.14 and 17 are designated by the same reference numerals, and a description thereof will be omitted. In this embodiment, no metallized surface 140 is used. Converging lenses 164 and 166 are formed on the back surface of the InP substrate 102. P side contact electrodes 168 and 170 are used for flip-chip bonding the semiconductor device onto, the ceramic substrate 162.

It with this embodiment is possible to obtain effects which are basically the same as those obtainable with the eighth embodiment.

In the described embodiments, the photodiodes are described as being pin photodiodes. However, the present invention is of course applicable to photodiodes of other types such as lateral pin photodiodes, avalanche photodiodes, and metal semiconductor metal (MSM) photodiodes.

In addition, the substrate material is not limited to InP, and other materials such as GaAs and AlGaAs may be used. For example, InGaAs, GaAs or the like may be used for the light absorbing layer in the case of a Si substrate. InGaAs or the like may be used for the light absorbing layer in the case of a InP substrate. GaAs or the like may be used for the light absorbing layer in the case of an AlGaAs substrate.

Further, the invention is not limited to the embodiments described above, but various variations and modifications may be made without departing from the scope of the present invention.

What is claimed is:

1. A semiconductor device comprising:
    a substrate;
    spaced first and second semiconductor light receiving elements monolithically integrated on said substrate, said elements each being capable of producing a respective electrical output dependent upon light thereto, and each having first and second terminals;
    a first flip-chip bonding pad formed on a surface of said device;
    a conductor element electrically interconnecting the first terminals of said light receiving elements in series, said conductor element including a centrally disposed portion electrically connected to said first flip-chip bonding pad;

a second flip-chip bonding pad formed on a surface of said device;

a first elongated electrode electrically interconnecting the second terminal of the first semiconductor light receiving element and said second flip-chip bonding pad;

a third flip-chip bonding pad formed on a surface of said device; and a second elongated electrode electrically interconnecting the second terminal of the second semiconductor light receiving element and said third flip-chip bonding pad, the lengths of said first and second electrodes being substantially the same.

2. A semiconductor device as set forth in claim 1, wherein the distance between the centers of the first and second pads is approximately the same as the distance between the centers of the first and third pads.

3. A semiconductor device as set forth in claim 2, wherein the distance between the centers of the second pad and the first light receiving element is approximately the same as the distance between the centers of the third pad and the second light receiving element.

4. A semiconductor device as set forth in claim 1, wherein said pads are arranged so that their respective centers are positioend at respective vertexes of an isosceles triangle.

5. A semiconductor device as set forth in claim 1, wherein said light receiving elements are pin photodiodes.

6. A semiconductor device as set forth in claim 1, wherein is included a dummy pad formed on a surface of device, the respective distances between the center of said dummy pad and the centers of said second and third pads being approximately the same.

7. A semiconductor device as set forth in claim 6, wherein said dummy pad, said second pad and said third pad are arranged so that their respective centers are positioned at respective vertexes of an isosceles triangle.

8. A semiconductor device as set forth in claim 1, wherein said first and second semiconductor light receiving elements are each pin photodiodes comprising a first n-type layer formed on said substrate, a second n-type layer formed on said first n-type layer, a third n-type layer formed on said second n-type layer, a first p-type region formed in said third n-type layer and making contact with said second n-type layer, a third electrode formed on said first n-type layer, and a fourth electrode formed on said first p-type region, said conductor element comprising an interconnection layer, said third electrode comprising said first terminal of the first light receiving element and said fourth electrode comprising said first terminal of the second light receiving element.

9. A semiconductor device as set forth in claim 8, wherein is included a passivation layer covering exposed surfaces of said first, second and third n-type layers of said first and second semiconductor light receiving elements between the fourth electrode of said first semiconductor light receiving element and the third electrode of the second semiconductor receiving light element, and also covering an exposed surface of said substrate between said first and second semiconductor light receiving elements, said interconnection layer being formed on said passivation layer.

10. A semiconductor device as set forth in claim 9, wherein said substrate is made of a semiinsulating material and said device further comprises a second p-type region formed at a surface portion of said substrate, said first n-type layer being formed on said second p-type region.

11. A semiconductor device as set forth in claim 10, wherein is included a metallized surface formed on a surface of said substrate opposite to said exposed surface thereof.

12. A semiconductor device as set forth in claim 10, wherein is included a lens portion formed on a surface of said substrate opposite to said exposed surface, said lens portion being located at a position directing light onto said first p-type region.

13. A semiconductor device as set forth in claim 8, wherein is incldued a second substrate, said flip-chip bonding pads each being bonded to said second substrate.

14. A semiconductor device as set forth in claim 8, wherein said substrate is made of semiinsulating InP, said first n-type layer is made of InP, said second n-type layer is made of InGaAs, said third n-type layer is made of InP, and said first p-type region is made of InP.

15. A semiconductor device as set forth in claim 8, wherein said substrate is made of a p-type material.

16. A semiconductor device as set forth in claim 15, wherein is included a lens portion formed on a surface of said substrate opposite to said exposed surface, said lens portion being located at a position for directing light onto said first p-type region.

17. A semiconductor device as set forth in claim 15, wherein is included a second substrate, flip-chop bonding pads each being bonded to said second substrate.

18. A semiconductor device as set forth in claim 15, wherein said substrate is made of InP, said first n-type layer is made of InP, said second n-type layer is made of InGaAs, said third n-type layer is made of InP, said first p-type region is made of InP.

19. A semiconductor device as set forth in claim 1, wherein is included a second substrate, said bonding pads each being bonded to said second substrate.

* * * * *

UNITED STATES PATENT AND TRADEMARK OFFICE
CERTIFICATE OF CORRECTION

PATENT NO. : 5,252,852

DATED : October 12, 1993

INVENTOR(S) : MASAO MAKIUCHI et al.

It is certified that error appears in the above-identified patent and that said Letters Patent is hereby corrected as shown below:

On title page, item [54] and col. 1, lines 1-4 delete in its entirety and substitute --SEMICONDUCTOR DEVICE HAVING PIN PHOTODIODES--.

In the Abstract, line 4 delete "the" and substitute --said--.

Column 1, line 54, delete "obtaine" and substitute --obtained--;

line 56, after "frequency" insert --which--;

line 61, after "on" insert --the--;

line 64, after "detection" delete "for" and substitute --, or--.

Column 2, line 16, after "uniform" insert --as--;

line 52, after "provide" insert --a--.

Column 3, line 4, delete "the" and substitute --a--;

line 5, delete "a" and substitute --the--;

line 54, before "The" start a new paragraph;

UNITED STATES PATENT AND TRADEMARK OFFICE
CERTIFICATE OF CORRECTION

PATENT NO. : 5,252,852  
DATED : October 12, 1993  
INVENTOR(S) : MASAO MAKIUCHI et al.

It is certified that error appears in the above-identified patent and that said Letters Patent is hereby corrected as shown below:

line 56, delete "by refering" and substitute --are explained with reference to--.

Column 3, lines 56 and 57, delete "those";

line 67 delete "a" and substitute --the--.

Column 4, line 4, after "L4" insert --,--;

line 23, delete "semioonductor" and substitute --semiconductor--;

line 32, after "different" insert --from--;

line 33, delete "device" and substitute --devices--;

line 48, delete "/";

line 57, after "flip-chip" insert --bonding--.

Column 5, line 17, after "embodiment" insert --, and--;

line 26, delete "I" and substitute --InP cap--;

line 27, after "Zn" insert --,--;

UNITED STATES PATENT AND TRADEMARK OFFICE
CERTIFICATE OF CORRECTION

PATENT NO. : 5,252,852
DATED : October 12, 1993
INVENTOR(S) : MASAO MAKIUCHI et al.

It is certified that error appears in the above-identified patent and that said Letters Patent is hereby corrected as shown below:

line 45, after "invention" insert --,--.

Column 6, line 13, delete "4" and substitute --1--;

line 30, after "to" insert --the--;

lines 36 and 51, after "C" delete --.--, (both occurrences);

line 42, delete "a";

lines 43 and 44 delete "semconductor" and substitute --semiconductor--, both occurrences;

line 47, delete "A" last occurrence;

line 63, delete "10-4" and substitute --$10^{-4}$--.

Column 7, lines 4 and 11 (three occurrences), after "C" delete --.--;

line 34, delete "by";

line 42, delete "technique";

UNITED STATES PATENT AND TRADEMARK OFFICE
CERTIFICATE OF CORRECTION

PATENT NO. : 5,252,852
DATED : October 12, 1993
INVENTOR(S) : MASAO MAKIUCHI et al.

It is certified that error appears in the above-identified patent and that said Letters Patent is hereby corrected as shown below:

line 58, after "having" insert --a--.

Column 8, line 8, delete "those";

line 15, after "above" insert --the--;

line 34, after 52 delete "," and substitute --and--, after "54" insert --,--;

line 45, after "structure" insert --,--.

Column 9, line 1, after "accordingly" insert --,--;

line 46 after "116" delete "," and substitute --and--, after "118" insert --,--.

Column 10, line 10, delete "locat" and insert --locations of the--;

line 18, delete "p-ty e" and substitute --p-type--;

line 41, after "116" delete ";", and before "118" insert --and--, after "118" insert --,--;

UNITED STATES PATENT AND TRADEMARK OFFICE
CERTIFICATE OF CORRECTION

PATENT NO. : 5,252,852

DATED : October 12, 1993

INVENTOR(S) : MASAO MAKIUCHI et al.

It is certified that error appears in the above-identified patent and that said Letters Patent is hereby corrected as shown below:

line 59, before and after "described" insert --is-- and --by-- respectively'

Column 11, line 4, change "Within" to --within--;

line 38, after "result" insert --,--;

line 39, delete "1/100" and substitute --1/100th--;

line 54, after "block" insert --the--;

line 64, delete --,--.

Column 12, line 32, delete ",";

line 34, after "It" insert --is possible--;

line 34, delete "is possible";

UNITED STATES PATENT AND TRADEMARK OFFICE
CERTIFICATE OF CORRECTION

PATENT NO. : 5,252,852
DATED : October 12, 1993
INVENTOR(S) : Masao Makiuchi, et al It is certified that error appears in the above-indentified patent and that said Letters Patent is hereby corrected as shown below:

Column 12, line 48, delete "a" and substitute --an--.

Signed and Sealed this

Sixth Day of September, 1994

Attest:

BRUCE LEHMAN

*Attesting Officer*   *Commissioner of Patents and Trademarks*